United States Patent
Hayashi et al.

(10) Patent No.: US 8,962,986 B2
(45) Date of Patent: Feb. 24, 2015

(54) CONDUCTIVE ADHESIVE, SOLAR CELL, METHOD FOR MANUFACTURING SOLAR CELL, AND SOLAR CELL MODULE

(75) Inventors: Hiroki Hayashi, Ichihara (JP); Shigeki Katogi, Tsukuba (JP); Shinichirou Sukata, Tsukuba (JP); Michiko Natori, Tsukuba (JP); Aya Momozaki, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 82 days.

(21) Appl. No.: 13/501,981

(22) PCT Filed: Oct. 14, 2010

(86) PCT No.: PCT/JP2010/068061
§ 371 (c)(1),
(2), (4) Date: May 25, 2012

(87) PCT Pub. No.: WO2011/046176
PCT Pub. Date: Apr. 21, 2011

(65) Prior Publication Data
US 2012/0227786 A1 Sep. 13, 2012

(30) Foreign Application Priority Data
Oct. 15, 2009 (JP) ................ P2009-238385

(51) Int. Cl.
*H01L 31/00* (2006.01)
*H01B 1/22* (2006.01)
*C09J 9/02* (2006.01)
(Continued)

(52) U.S. Cl.
CPC ... *H01B 1/22* (2013.01); *C09J 9/02* (2013.01); *H01L 31/022425* (2013.01); *H01L 31/048* (2013.01); *H01L 31/0512* (2013.01); *Y02E 10/50* (2013.01)
USPC ............................................ 136/256

(58) Field of Classification Search
USPC ....................... 156/307.7; 136/256
See application file for complete search history.

(56) References Cited

U.S. PATENT DOCUMENTS 5,744,533 A * 4/1998 Iwamoto et al. ............. 524/440
8,298,363 B2 * 10/2012 Hashimoto et al. ........ 156/307.7
(Continued)

FOREIGN PATENT DOCUMENTS

| CN | 1395259 A | 2/2003 |
| JP | 08-330615 | 12/1996 |

(Continued)

OTHER PUBLICATIONS

International Preliminary Report on Patentability, issued from the International Bureau, in counterpart International Application No. PCT/JP2010/068061, dated May 24, 2012, pp. 1-8.
(Continued)

*Primary Examiner* — Eli Mekhlin
(74) *Attorney, Agent, or Firm* — Antonelli, Terry & Kraus, LLP.

(57) ABSTRACT

A conductive adhesive comprising conductive particles including metal, a thermosetting resin, a flux activator, and preferably a rheology control agent is provided. A melting point of the conductive particles is preferably 220° C. or lower. The conductive adhesive is used for electrically connecting and adhering wiring members 4a, 4b to electrodes 3a, 3b connected to a solar battery cell 6.

12 Claims, 2 Drawing Sheets

(51) Int. Cl.
*H01L 31/0224* (2006.01)
*H01L 31/048* (2014.01)
*H01L 31/05* (2014.01)

(56) References Cited

U.S. PATENT DOCUMENTS

| | | | |
|---|---|---|---|
| 2002/0153513 A1* | 10/2002 | Kurihara et al. | 252/519.2 |
| 2003/0122257 A1* | 7/2003 | Onami et al. | 257/762 |
| 2008/0121265 A1* | 5/2008 | Hishida et al. | 136/244 |
| 2010/0221559 A1* | 9/2010 | Konno et al. | 428/457 |

FOREIGN PATENT DOCUMENTS

| | | |
|---|---|---|
| JP | 2001085824 A | 3/2001 |
| JP | 2002-263880 | 9/2002 |
| JP | 2003-016838 | 1/2003 |
| JP | 2003-133570 | 5/2003 |
| JP | 2004-204256 | 7/2004 |
| JP | 2005-243935 | 9/2005 |
| JP | 2006-041309 | 2/2006 |
| JP | 2007-019106 | 1/2007 |
| JP | 2007-265635 | 10/2007 |
| TW | 200927870 | 7/2009 |
| TW | 200931672 | 7/2009 |
| WO | WO 2007/125650 | 11/2007 |
| WO | WO 2007/149883 A1 | 12/2007 |
| WO | WO 2009/011209 A1 | 1/2009 |
| WO | WO 2009011209 A1 * | 1/2009 |
| WO | WO 2009044801 A1 * | 4/2009 |
| WO | WO 2009/063841 | 5/2009 |

OTHER PUBLICATIONS

International Search Report issued in corresponding International Application No. PCT/JP2010/068061, mailed Nov. 16, 2010, pp. 1-2.
Office Action from State Intellectual Property Office of People's Republic of China in the corresponding Patent Application No. 201080046536.7 dated Mar. 3, 2014, 11 pages in Chinese.
Chinese Official Action dated Sep. 5, 2014, for CN Application No. 201080046536.7.
C. Shen, et al., "Waterproof Sealing Material Manual", published by China Building Materials Industry Press, Jun. 30, 2000, pp. 1108-1125.

* cited by examiner

Fig.2
(a)
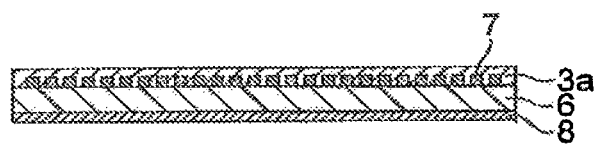
(b)
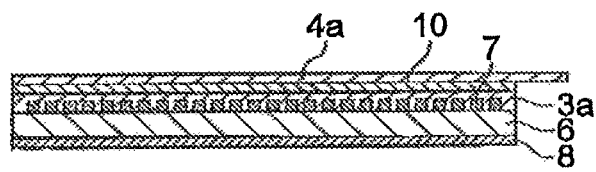
(c)
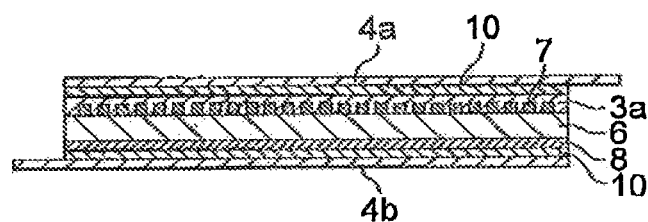
(d)
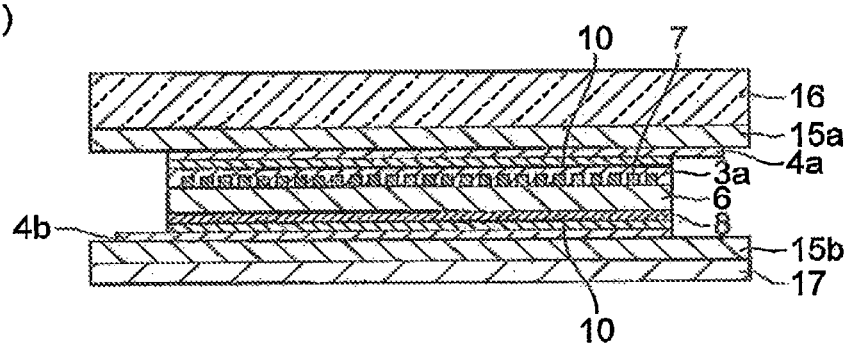

CONDUCTIVE ADHESIVE, SOLAR CELL, METHOD FOR MANUFACTURING SOLAR CELL, AND SOLAR CELL MODULE

TECHNICAL FIELD

The present invention relates to a conductive adhesive, a solar battery, a method for manufacturing the solar battery, and a solar battery module.

BACKGROUND ART

As a means of solving increasingly serious global warming and fossil energy depletion problems, a solar battery which is a power generation system using sunlight is attracting attention. Currently, a mainstream solar battery has a configuration in which solar battery cells having a monocrystalline or polycrystalline Si wafer are connected in series or in parallel, with electrodes and metal wiring members interposed therebetween. Usually, the connection of electrodes of solar battery cells and metal wiring members has been performed using an inexpensive solder exhibiting favorable conductive properties (Patent Literature 1). Recently, taking environmental problems into consideration, a method of covering copper wires, which are wiring members, with a Pb-free Sn—Ag—Cu solder, and heating them to a temperature equal to or higher than the melting temperature of the solder to connect electrodes of solar battery cells and wiring members has been known (Patent Literatures 1 and 2).

However, upon such a connection, since it is necessary to perform the heating at a temperature of 260° C. or higher that exceeds the melting point of the Sn—Ag—Cu solder, a problem is that warpage and cracking of the solar battery cells occur to thereby reduce yield. Recently, since there is a tendency of thinning a thickness of the solar battery cell for the purpose of reducing cost, a measure for preventing the warpage and cracking has urgently been demanded.

On the other hand, the use of conductive adhesives which are capable of electrical connection at a lower temperature has also been proposed (Patent Literatures 3 to 6). These conductive adhesives are compositions in which metal particles typified by silver particles are dispersed in a thermosetting resin, wherein the electrical connection is accomplished mainly by bringing the metal particles physically into contact with electrodes of solar battery cells and wiring members.

CITATION LIST

Patent Literature

[Patent Literature 1] Japanese Patent Application Laid-Open Publication No. 2002-263880
[Patent Literature 2] Japanese Patent Application Laid-Open Publication No. 2004-204256
[Patent Literature 3] Japanese Patent Application Laid-Open Publication No. 8-330615
[Patent Literature 4] Japanese Patent Application Laid-Open Publication No. 2003-133570
[Patent Literature 5] Japanese Patent Application Laid-Open Publication No. 2005-243935
[Patent Literature 6] Japanese Patent Application Laid-Open Publication No. 2007-265635

SUMMARY OF INVENTION

Technical Problem

However, it has been revealed that a solar battery manufactured using a conventional conductive adhesive containing metal particles is not necessarily sufficient in terms of reliability. Specifically, there has been a problem that when the solar battery is exposed under a high temperature and high humidity environment, characteristics thereof significantly deteriorate.

Then, in view of the problems of the prior art, a main object of the present invention is to provide a conductive adhesive capable of connection at a lower temperature than a Sn—Ag—Cu solder, wherein, when the conductive adhesive is used for adhering wiring members to electrodes of a solar battery, characteristics of the solar battery are sufficiently maintained even after a high temperature and high humidity test. A further object of the present invention is to provide a solar battery and a solar battery module capable of sufficiently maintaining the characteristics even after a high temperature and high humidity test.

Solution to Problem

The present invention relates to a conductive adhesive comprising conductive particles including a metal, a thermosetting resin, and a flux activator. A melting point of the conductive particles is 220° C. or lower. The conductive adhesive of the present invention is used for adhering a wiring member to an electrode connected to a solar battery while electrically connecting the wiring member to the electrode.

According to the conductive adhesive of the present invention, while the conductive adhesive is capable of connection at a lower temperature than a Sn—Ag—Cu solder, when the conductive adhesive is used for adhering wiring members to electrodes of a solar battery, characteristics of the solar battery are sufficiently maintained even after a high temperature and high humidity test.

The present invention also relates to a conductive adhesive comprising conductive particles including a metal, a thermosetting resin, a flux activator, and a rheology control agent. This conductive adhesive has a viscosity of 100 to 500 Pa·s, as measured using a rotation viscometer under conditions of a measurement temperature of 25° C. and a rotation rate of 0.5 rpm. In addition, the conductive adhesive is used for electrically connecting and adhering wiring members to an electrode by a method including a step of heating the conductive adhesive to a temperature at which the conductive particles melt, with the conductive adhesive being interposed between electrodes connected to a solar battery cell and wiring members. The conductive adhesive of the present invention may comprise conductive particles, a thermosetting resin, a flux activator, and inorganic fine particles or organic fine particles.

According to the conductive adhesive of the above present invention, while the conductive adhesive is capable of connection at a lower temperature than a Sn—Ag—Cu solder, when the conductive adhesive is used for adhering wiring members to electrodes of a solar battery, characteristics of the solar battery are sufficiently maintained even after a high temperature and high humidity test. In addition, by using the rheology control agent, or the inorganic fine particles or the organic fine particles, excellent storage stability of the conductive adhesive is exerted while securing sufficient continuity properties. Also in this case, a melting point of the conductive particles is preferably 220° C. or lower. This enables adhesion at a lower temperature and warpage and cracking of a solar battery cell are sufficiently prevented.

The conductive adhesive of the present invention preferably has a ratio of viscosity as measured after being left to stand at 25° C. for 24 hours to viscosity measured before being left to stand, of 0.7 to 1.5. These viscosities are measured using a rotation viscometer under conditions of a measurement temperature of 25° C. and a rotation rate of 0.5 rpm.

The conductive particles preferably include at least one kind of metal selected from the group consisting of bismuth, indium, tin and zinc. This makes it possible to lower the melting point of the conductive particles while maintaining favorable continuity properties.

The thermosetting resin preferably includes at least one of an epoxy resin and a (meth)acrylic resin.

The flux activator is preferably a compound having a hydroxyl group and a carboxyl group.

In another aspect, the present invention relates to a solar battery. The solar battery of the present invention comprises a solar battery cell, electrodes connected to a light-receiving surface and a rear surface of the solar battery cell, respectively, a first wiring member placed opposite to the electrode of the light-receiving surface side and a second wiring member placed opposite to the electrode of the rear surface side, and the conductive adhesive of the above present invention, interposed between the electrode of the light-receiving surface side and the first wiring member and between the electrode of the rear surface side and the second wiring member. The first wiring member and the second wiring member each are electrically connected and adhered to the electrode.

The characteristics of the solar battery of the above present invention is sufficiently maintained even after a high temperature and high humidity test.

In still another aspect, the present invention relates to a method for manufacturing a solar battery. The manufacturing method of the present invention comprises the steps of applying the conductive adhesive of the above present invention to electrodes connected to a light-receiving surface and a rear surface of a solar battery cell, respectively, placing a first wiring member opposite to the electrode of the light-receiving surface side and placing a second wiring member opposite to the electrode of the rear surface side, with the applied conductive adhesive interposed therebetween, and placing a sealing resin on a side, opposite to the solar battery cell, of each of the first wiring member and the second wiring member, placing a glass substrate on the sealing resin of the light-receiving surface side, placing a protective film on the sealing resin of the rear surface side, and heating the whole in the obtained state, thereby sealing the solar battery cell while electrically connecting and adhering the first wiring member and the second wiring member to the respective electrodes.

According to the manufacturing method of the above present invention, it is possible to efficiently manufacture a solar battery which sufficiently maintains the characteristics even after a high temperature and high humidity test.

In still another aspect, the present invention relates to a solar battery module. The solar battery module of the present invention comprises a plurality of solar battery cells, electrodes connected to a light-receiving surface and a rear surface of each of the plurality of solar battery cells, respectively, a first wiring member placed opposite to the electrode of the light-receiving surface side and a second wiring member placed opposite to the electrode of the rear surface side, and the conductive adhesive of the above present invention, interposed between the electrode of the light-receiving surface side and the first wiring member and between the electrode of the rear surface side and the second wiring member, respectively. The first wiring member and the second wiring member each are electrically connected and adhered to the electrode. The wiring members are connected to each other so that the plurality of solar battery cells are electrically connected.

The solar battery module of the above present invention has characteristics sufficiently maintained even after a high temperature and high humidity test.

In the solar battery and the solar battery module, the first wiring member and the second wiring member each are preferably electrically connected and adhered to the electrode by a method including a step of heating the conductive adhesive to a temperature at which the conductive particles melt, with the conductive adhesive being interposed between the electrode on the light-receiving surface side and the first wiring member and between the electrode on the rear surface side and the second wiring member.

By the heating at the temperature at which the conductive particles melt, the conductive particles melt and aggregate to thereby form a path of a metal bond between the electrode—the wiring member, and the thermosetting resin is cured around the path to thereby reinforce the path of the metal bond. As a result, it is considered that characteristics of the solar battery are sufficiently maintained even after a high temperature and high humidity test.

Advantageous Effects of Invention

According to the conductive adhesive of the present invention, while the conductive adhesive is capable of connection at a lower temperature than a Sn—Ag—Cu solder, when the conductive adhesive is used for adhering wiring members to electrodes of a solar battery, characteristics of the solar battery are sufficiently maintained even after a high temperature and high humidity test.

Furthermore, conventionally, changes in characteristics such as a decrease in viscosity may be sometimes large in the case of storing a conductive adhesive for a long period and thus there has also been a demand for further improvement in storage stability of a conductive adhesive, and according to the conductive adhesive of the invention of the present application containing a rheology control agent, inorganic fine particles and the like, excellent storage stability of the conductive adhesive is exerted while securing sufficient continuity properties.

BRIEF DESCRIPTION OF DRAWINGS

FIG. 2 is a schematic view showing one embodiment of a method for manufacturing a solar battery.

DESCRIPTION OF EMBODIMENTS

Figure 1:
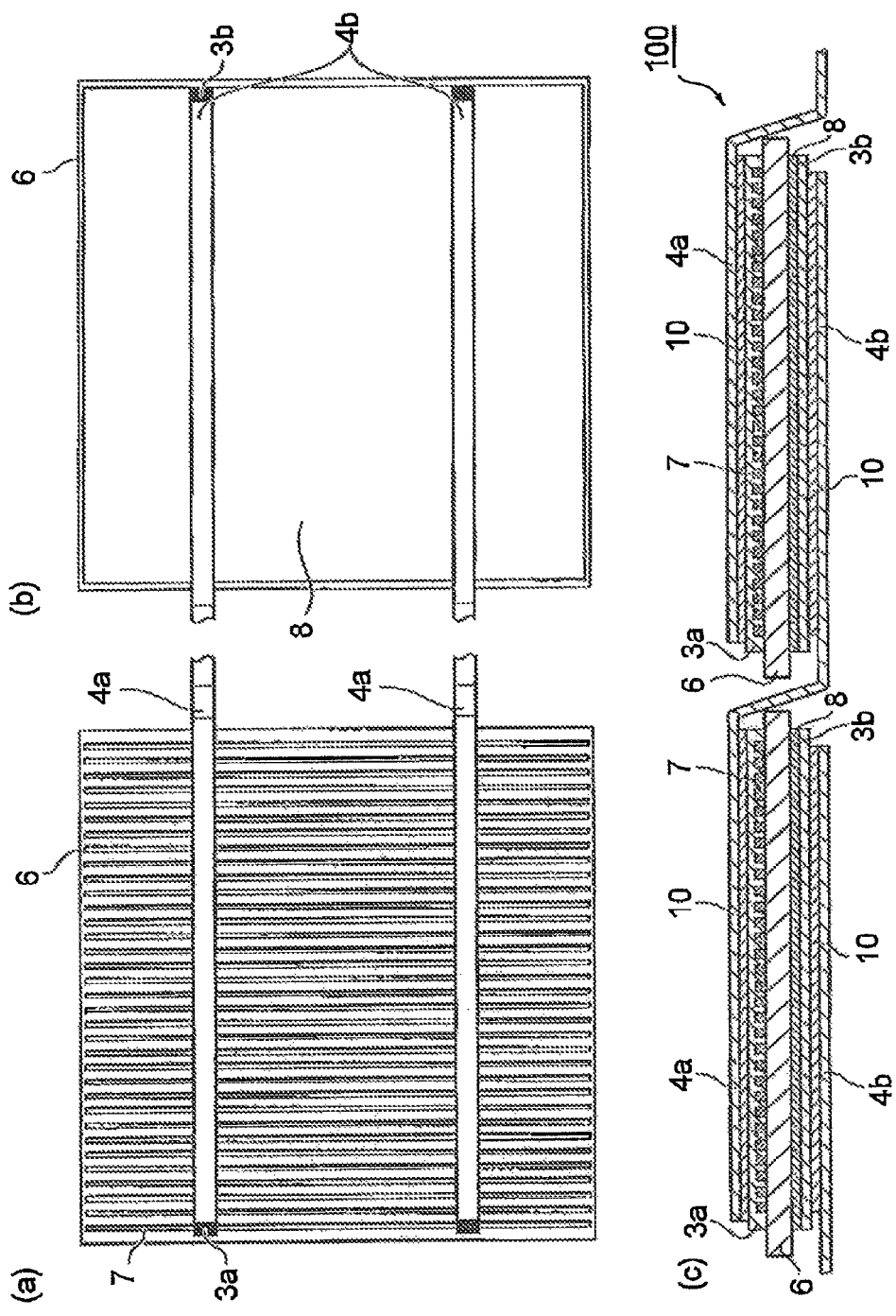
FIG. 1 is a schematic view showing one embodiment of a solar battery module.

A conductive adhesive of the present embodiment comprises at least conductive particles including a metal, and a thermosetting resin.

A melting point of the conductive particles is preferably 220° C. or lower, and more preferably 200° C. or lower. While the melting point of the conductive particles is preferably low, a lower limit thereof is usually about 120° C. The conductive particles having such a melting point include at least one kind of metal selected from, for example, bismuth (Bi), indium (In), tin (Sn) and zinc (Zn). The conductive particles are often formed from an alloy. It is preferable that the conductive particles do not substantially include lead. More specifically, the conductive particles are metal particles constituted by a solder selected from Sn42-Bi58 solder (melting point: 138° C.), Sn48-In52 solder (melting point: 117° C.), Sn42-Bi57-Ag1 solder (melting point: 139° C.), Sn90-Ag2-Cu0.5-Bi7.5 solder (melting point: 189° C.), Sn96-Zn8-Bi3 solder (melting point: 190° C.) and Sn91-Zn9 solder (melting point: 197° C.). These solders are preferable because of showing apparent solidification behavior after being melted. They are used singly or in combinations of two or more.

The conductive particles may be constituted by only a metal, or may be particles having a core particle made of a solid material other than metals, such as ceramic, silica and resin, and a metal film covering the surface thereof. The core particle may also be a metal particle. It is sufficient that a melting point of the metal film covering the surface of the conductive particle be 220° C.

The conductive adhesive may comprise conductive particles having a melting point of higher than 220° C., in addition to the conductive particles having a melting point of 220° C. or lower. Such conductive particles are constituted by, for example, Pt, Au, Ag, Cu, Ni, Pd, Al, or an alloy including a combination thereof. More specifically, examples thereof include Au particles, Ag particles, Cu particles and Ag-plated Cu particles.

A mean particle size of the conductive particles is not particularly limited, but it is preferably 0.1 to 100 μm. If this mean particle size is less than 0.1 μm, viscosity of an adhesive composition tends to be higher to thereby reduce workability. In addition, if the mean particle size of the conductive particles exceeds 100 μm, printability tends to deteriorate and the enhancing effect on connection reliability tends to be smaller. From the viewpoint of making printability and workability of the adhesive composition more favorable, this mean particle size is more preferably 1.0 to 70 μm. From the viewpoint of enhancing storage stability of the adhesive composition and mounting reliability of a cured article, the mean particle size of the conductive particles is particularly preferably 5.0 to 50 μm.

A content of the conductive particles is preferably an amount such that a mass of a metal included in the conductive particles is 5 to 95% by mass based on the total mass of the conductive adhesive. If the amount of the conductive particles is less than 5% by mass, conductive properties of the cured article of the conductive adhesive tend to deteriorate. On the other hand, if the amount of the conductive particles exceeds 95% by mass, viscosity of the conductive adhesive tends to be higher and workability thereof tends to deteriorate. In addition, since amounts of components other than the conductive particles in the conductive adhesive are relatively small, mounting reliability of the cured article tends to deteriorate. The amount of the conductive particles is preferably 10 to 90% by mass from the viewpoint of enhancing workability or conductive properties.

The thermosetting resin has an action of being cured by heating to adhere to an adherend, and acts as a binder component which allows the conductive particles and the rheology control agent described later in the conductive adhesive to bind to each other. The thermosetting resin is selected from, for example, an epoxy resin, a (meth)acrylic resin, a maleimide resin and a cyanate resin, and precursors thereof. Among them, compounds having a polymerizable carbon-carbon double bond, typified by a (meth)acrylic resin and a maleimide resin, and an epoxy resin are preferable. These thermosetting resins are excellent in heat resistance and adhesion properties and can also be handled at a liquid state if being optionally dissolved or dispersed in an organic solvent, and thus are also excellent in workability. The aforementioned thermosetting resins are used singly or in combinations of two or more.

The (meth)acrylic resin is constituted by a compound having a polymerizable carbon-carbon double bond. Examples of such a compound include a monoacrylate compound, a monomethacrylate compound, a diacrylate compound and a dimethacrylate compound.

Examples of the monoacrylate compound include methyl acrylate, ethyl acrylate, propyl acrylate, isopropyl acrylate, n-butyl acrylate, isobutyl acrylate, tert-butyl acrylate, amyl acrylate, isoamyl acrylate, hexyl acrylate, heptyl acrylate, octyl acrylate, 2-ethylhexyl acrylate, nonyl acrylate, decyl acrylate, isodecyl acrylate, lauryl acrylate, tridecyl acrylate, hexadecyl acrylate, stearyl acrylate, isostearyl acrylate, cyclohexyl acrylate, isobornyl acrylate, diethylene glycol acrylate, polyethylene glycol acrylate, polypropylene acrylate, 2-methoxyethyl acrylate, 2-ethoxyethyl acrylate, 2-butoxyethyl acrylate, methoxy diethylene glycol acrylate, methoxy polyethylene glycol acrylate, dicyclopentenyloxyethyl acrylate, 2-phenoxyethyl acrylate, phenoxy diethylene glycol acrylate, phenoxy polyethylene glycol acrylate, 2-benzoyloxyethyl acrylate, 2-hydroxy-3-phenoxypropyl acrylate, benzyl acrylate, 2-cyanoethyl acrylate, γ-acryloxyethyltrimethoxysilane, glycidyl acrylate, tetrahydrofurfuryl acrylate, dimethylaminoethyl acrylate, diethylaminoethyl acrylate, acryloxyethyl phosphate and acryloxyethylphenyl acid phosphate.

Examples of the monomethacrylate compound include methyl methacrylate, ethyl methacrylate, propyl methacrylate, isopropyl methacrylate, n-butyl methacrylate, isobutyl methacrylate, tert-butyl methacrylate, amyl methacrylate, isoamyl methacrylate, hexyl methacrylate, heptyl methacrylate, octyl methacrylate, 2-ethylhexyl methacrylate, nonyl methacrylate, decyl methacrylate, isodecyl methacrylate, lauryl methacrylate, tridecyl methacrylate, hexadecyl methacrylate, stearyl methacrylate, isostearyl methacrylate, cyclohexyl methacrylate, isobornyl methacrylate, diethylene glycol methacrylate, polyethylene glycol methacrylate, polypropylene methacrylate, 2-methoxyethyl methacrylate, 2-ethoxyethyl methacrylate, 2-butoxyethyl methacrylate, methoxy diethylene glycol methacrylate, methoxy polyethylene glycol methacrylate, dicyclopentenyloxyethyl methacrylate, 2-phenoxyethyl methacrylate, phenoxydiethylene glycol methacrylate, phenoxypolyethylene glycol methacrylate, 2-benzoyloxyethyl methacrylate, 2-hydroxy-3-phenoxypropyl methacrylate, benzyl methacrylate, 2-cyanoethyl methacrylate, γ-methacryloxyethyl trimethoxysilane, glycidyl methacrylate, tetrahydrofurfuryl methacrylate, dimethylaminoethyl methacrylate, diethylaminoethyl methacrylate, methacryloxyethyl phosphate and methacryloxyethylphenyl acid phosphate.

Examples of the diacrylate compound include ethylene glycol diacrylate, 1,4-butanediol diacrylate, 1,6-hexanediol diacrylate, 1,9-nonanediol diacrylate, 1,3-butanediol diacrylate, neopentyl glycol diacrylate, diethylene glycol diacrylate, triethylene glycol diacrylate, tetraethylene glycol diacrylate, polyethylene glycol diacrylate, tripropylene glycol diacrylate, polypropylene glycol diacrylate, a reaction product of 1 mol of bisphenol A, bisphenol F or bisphenol AD and 2 mol of glycidyl acrylate, diacrylate of an adduct of bisphenol A, bisphenol F or bisphenol AD with polyethylene oxide, diacrylate of an adduct of bisphenol A, bisphenol F or bisphenol AD with polypropylene oxide, bis(acryloxypropyl)polydimethylsiloxane and a bis(acryloxypropyl)methylsiloxane-dimethylsiloxane copolymer.

Examples of the dimethacrylate compound include ethylene glycol dimethacrylate, 1,4-butanediol dimethacrylate, 1,6-hexanediol dimethacrylate, 1,9-nonanediol dimethacrylate, 1,3-butanediol dimethacrylate, neopentyl glycol dimethacrylate, diethylene glycol dimethacrylate, triethylene glycol dimethacrylate, tetraethylene glycol dimethacrylate, polyethylene glycol dimethacrylate, tripropylene glycol dimethacrylate, polypropylene glycol dimethacrylate, a reaction product of 1 mol of bisphenol A, bisphenol F or bisphenol AD and 2 mol of glycidyl methacrylate, dimethacrylate of an adduct of bisphenol A, bisphenol F or bisphenol AD with polyethylene oxide, an adduct of bisphenol F or bisphenol AD with polypropylene oxide, bis(methacryloxypropyl)polydimethylsiloxane and a bis(methacryloxypropyl)methylsiloxane-dimethylsiloxane copolymer.

These compounds having a polymerizable carbon-carbon double bond are used singly or in combinations of two or more.

When the thermosetting resin is constituted by the compound having a polymerizable carbon-carbon double bond, the conductive adhesive preferably comprises a radical polymerization initiator. The radical polymerization initiator is suitably organic peroxide from the viewpoint of effectively suppressing a void. The organic peroxide preferably has a one-minute half-life temperature of 70 to 170° C. from the viewpoint of enhancing curability and viscosity stability of the conductive adhesive.

Examples of the radical polymerization initiator include 1,1,3,3-tetramethylbutylperoxy-2-ethylhexanoate, 1,1-bis(tert-butylperoxy)cyclohexane, 1,1-bis(tert-butylperoxy)cyclododecane, di-tert-butylperoxyisophthalate, tert-butylperoxybenzoate, dicumyl peroxide, tert-butyl cumyl peroxide, 2,5-dimethyl-2,5-di(tert-butylperoxy)hexane, 2,5-dimethyl-2,5-di(tert-butylperoxy)-3-hexyne and cumene hydroperoxide. They are used singly or in combinations of two or more.

A blending proportion of the radical polymerization initiator is preferably 0.01 to 20% by mass, more preferably 0.1 to 10% by mass, and further preferably 0.5 to 5% by mass based on the whole amount of the components other than the conductive particles in the conductive adhesive.

The epoxy resin can be used without being particularly limited as long as it is a compound having two or more epoxy groups. Examples of such an epoxy resin include epoxy resins derived from bisphenol A, bisphenol F or bisphenol AD and epichlorohydrin.

As such an epoxy resin, commercial products are available. Specific examples thereof include bisphenol A type epoxy resins, AER-X8501 (produced by Asahi Chemical Industry Co., Ltd., trade name), R-301 (produced by Japan Epoxy Resin Co. Ltd., trade name) and YL-980 (produced by Japan Epoxy Resin Co. Ltd., trade name); bisphenol F type epoxy resins, YDF-170 (produced by Tohto Kasei Co., Ltd., trade name) and YL-983 (produced by Japan Epoxy Resin Co. Ltd., trade name); a bisphenol AD type epoxy resin, R-1710 (produced by Mitsui Petrochemical Industries, Ltd., trade name); phenol novolac type epoxy resins, N-7305 (produced by DIC Corporation, trade name) and Quatrex-2010 (produced by The Dow Chemical Company, trade name); cresol novolac type epoxy resins, YDCN-7025 (produced by Tohto Kasei Co., Ltd., trade name) and EOCN-100 (produced by Nippon Kayaku Co., Ltd., trade name); multifunctional epoxy resins, EPPN-501 (produced by Nippon Kayaku Co., Ltd., trade name), TACTIX-742 (produced by The Dow Chemical Company, trade name), VG-3010 (produced by Mitsui Petrochemical Industries, Ltd., trade name) and 1032S (produced by Japan Epoxy Resin Co. Ltd., trade name); an epoxy resin having a naphthalene backbone, HP-4032 (produced by DIC Corporation, trade name); alicyclic epoxy resins, EHPE-3150 and CEL-3000 (both produced by Daicel Corporation, trade name), DME-100 (produced by New Japan Chemical Co., Ltd., trade name), and EX-216L (produced by Nagase Chemicals Ltd., trade name); an aliphatic epoxy resin, W-100 (New Japan Chemical Co., Ltd., trade name); amine type epoxy resins, ELM-100 (produced by Sumitomo Chemical Industry Co., Ltd., trade name), YH-434L (produced by Tohto Kasei Co., Ltd., trade name), TETRAD-X and TETRAC-C (both Mitsubishi Gas Chemical Company, Inc., trade name), and 630 and 630LSD (both produced by Japan Epoxy Resin Co. Ltd., trade name); a resorcin type epoxy resin, DENACOL EX-201 (produced by Nagase Chemicals Ltd., trade name); a neopentyl glycol type epoxy resin, DENACOL EX-211 (produced by Nagase Chemicals Ltd., trade name); a hexanediol type epoxy resin, DENACOL EX-212 (produced by Nagase Chemicals Ltd., trade name); ethylene glycol/propylene glycol type epoxy resins, DENACOL EX series (EX-810, 811, 850, 851, 821, 830, 832, 841, 861 (all produced by Nagase Chemicals Ltd., trade name)); and epoxy resins represented by the following formula (I), E-XL-24 and E-XL-3L (both produced by Mitsui Chemicals, Inc., trade name). In formula (I), k denotes an integer of 1 to 5. Among these epoxy resins, bisphenol A type epoxy resins, bisphenol F type epoxy resins, bisphenol AD type epoxy resins and amine type epoxy resins with less ionic impurities and excellent reactivity are particularly preferable.

[Chemical Formula 1]

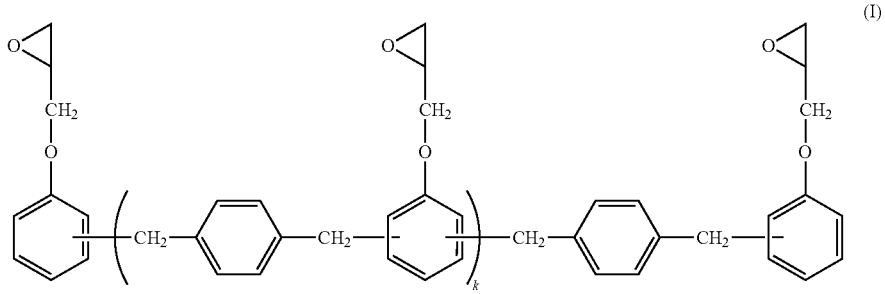

(I)

The aforementioned epoxy resins are used singly or in combinations of two or more.

If the thermosetting resin is an epoxy resin, the conductive adhesive may further comprise an epoxy compound having only one epoxy group, as a reactive diluent. Such an epoxy compound is available as a commercial product. Specific examples thereof include PGE (produced by Nippon Kayaku Co., Ltd., trade name), PP-101 (produced by Tohto Kasei Co., Ltd., trade name), ED-502, ED-509, ED-509S (produced by ADEKA CORPORATION, trade name), YED-122 (produced by Yuka Shell Epoxy Co., Ltd., trade name), KBM-403

(produced by Shin-Etsu Chemical Co., Ltd., trade name), and TSL-8350, TSL-8355 and TSL-9905 (produced by Toshiba Silicone Co., Ltd., trade name). These are used singly or in combinations of two or more.

A blending proportion of the reactive diluent may be in any range as long as the effects of the present invention are not impaired, and it is preferably 0 to 30% by mass based on the total amount of the above epoxy resin.

When the thermosetting resin is an epoxy resin, it is suitable that the conductive adhesive further comprises a curing agent for an epoxy resin, and more suitable that the conductive adhesive further comprises a curing accelerator for enhancing curability, in addition to the curing agent.

The curing agent is not particularly limited as long as it is one conventionally used, and commercial products are available. Examples of the commercial available curing agent include phenol novolac resins, H-1 (produced by Meiwa Plastic Industries, Ltd., trade name) and VR-9300 (produced by Mitsui Toatsu Chemical, Inc., trade name); a phenol aralkyl resin, XL-225 (produced by Mitsui Toatsu Chemical, Inc., trade name); a p-cresol novolac resin represented by the following formula (II), MTPC (produced by Honshu Chemical Industry Co., Ltd., trade name); an allylated phenol novolac resin, AL-VR-9300 (produced by Mitsui Toatsu Chemical, Inc., trade name); and a special phenol resin represented by the following formula (III), PP-700-300 (produced by Nippon Petro Chemicals Co., Ltd., trade name). In formula (II), each R1 independently denotes a monovalent hydrocarbon group, preferably a methyl group or an allyl group, and q denotes an integer of 1 to 5. In formula (III), R2 denotes an alkyl group, preferably a methyl group or an ethyl group, R3 denotes a hydrogen atom or a monovalent hydrocarbon group, and p denotes an integer of 2 to 4.

[Chemical Formula 2]

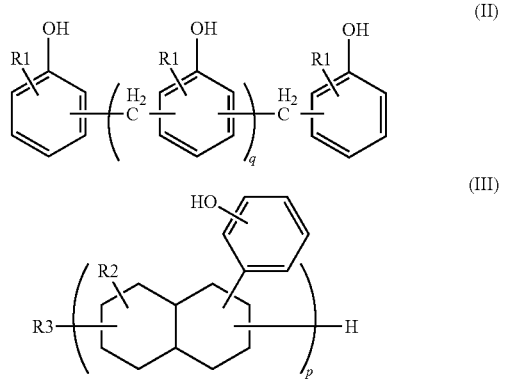

A blending proportion of the curing agent is preferably a proportion such that the whole amount of a reaction active group in the curing agent is 0.3 to 1.2 equivalents, more preferably a proportion of 0.4 to 1.0 equivalent, and further preferably a proportion of 0.5 to 1.0 equivalent, based on 1.0 equivalent of an epoxy group in the epoxy resin. If the whole amount of the reaction active group is less than 0.2 equivalents, reflow crack resistance of the conductive adhesive tends to deteriorate, and if it exceeds 1.2 equivalents, viscosity of the conductive adhesive tends to increase, and workability thereof tends to deteriorate. The above reaction active group refers to a substituent having reaction activity with an epoxy resin, and examples thereof include a phenolic hydroxyl group.

The curing accelerator is not particularly limited as long as it is one conventionally used as a curing accelerator such as dicyandiamide, commercial products are available. Examples of the commercial products include dibasic acid dihydrazides represented by the following formula (IV), ADH, PDH and SDH (all produced by Japan Hydrazine Company, Inc., trade name); and a microcapsule type curing agent including a reaction product of an epoxy resin and an amine compound, Novacure (produced by Asahi Chemical Industry Co., Ltd., trade name). In formula (IV), R4 denotes a divalent aromatic group, or a linear or branched alkylene group having 1 to 12 carbon atoms, preferably m-phenylene group or a p-phenylene group. These curing accelerators are used singly or in combinations of two or more.

[Chemical Formula 3]

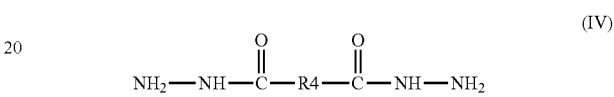

As a commercially available curing accelerator, in addition to the aforementioned ones, for example, organic boron salt compounds, EMZ·K and TPPK (both produced by HOKKO CHEMICAL INDUSTRY CO., LTD., trade name); tertiary amines or salts thereof, DBU, U-CAT102, 106, 830, 840 and 5002 (all produced by San-Apro Ltd., trade name); and imidazoles, Curezol, 2PZ-CN, 2P4 MHZ, C17Z, 2PZ-OK, 2PZ-CNS and C11Z-CNS (all produced by SHIKOKU CHEMICALS CORPORATION, trade name) may also be used.

A blending proportion of the curing accelerator is preferably 0.01 to 90 parts by mass and more preferably 0.1 to 50 parts by mass, based on 100 parts by mass of the epoxy resin. If this blending proportion of the curing accelerator is less than 0.01 parts by mass, curability tends to deteriorate, and if it exceeds 90 parts by mass, viscosity tends to increase, and workability upon handling the conductive adhesive tends to deteriorate.

The conductive adhesive preferably comprises a flux activator. The flux activator is a compound having a function of removing an oxide film formed on the surfaces of the conductive particles including a metal. As the flux activator, a compound not inhibiting a curing reaction of the thermosetting resin is used. Such a compound includes rosin-based resins, and compounds containing a carboxyl group, a phenolic hydroxyl group or a hydroxyl group. Compounds containing a hydroxyl group and a carboxyl group are preferable, and aliphatic dihydroxy carboxylic acids are particularly preferable, because of exhibiting favorable flux activity and exhibiting reactivity with the epoxy resin to be used as the thermosetting resin. Specifically, a compound represented by the following formula (V) or tartaric acid is preferable. In formula (V), R5 denotes an alkyl group having 1 to 5 carbon atoms that may have a substituent, and it is preferably a methyl group, an ethyl group, a propyl group, a butyl group or a pentyl group from the viewpoint of effectively exerting the aforementioned effects according to the present invention. In addition, n and m each independently denote an integer of 0 to 5, and from the viewpoint of more effectively exerting the aforementioned effects according to the present invention, it is preferable that n denote 0 and m denote 1, or both of n and m denote 1, and it is more preferable that both of n and m denote 1.

[Chemical Formula 4]

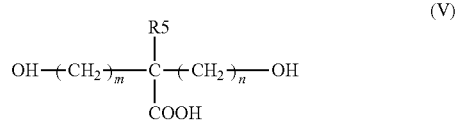
(V)

Examples of the compound represented by the above formula (V) include 2,2-bishydroxymethylpropionic acid, 2,2-bishydroxymethylbutanoic acid and 2,2-bishydroxymethylpentanoic acid.

A content of the flux activator is preferably 0.5 to 20 parts by mass based on 100 parts by mass of the conductive particles, from the viewpoint of effectively exerting the above effects according to the present invention. Furthermore, from the viewpoint of storage stability and conductive properties, it is more preferably 1.0 to 10 parts by mass. If the content of the flux activator is less than 0.5 parts by mass, meltability of a metal constituting the conductive particles tends to deteriorate and conductive properties tend to deteriorate, and if it exceeds 20 parts by mass, storage stability and printability tend to deteriorate.

The conductive adhesive preferably comprises a rheology control agent. This rheology control agent is a compound which gives, to the conductive adhesive, thixotropic properties exhibiting a high viscosity in the case where a shear force is low and exhibiting a low viscosity in the case where a shear force is high. Examples of the compound to be used as the rheology control agent include compounds having an ester bond, such as hardened castor oil, beeswax and carnauba wax, (for example, ITOHWAX CO-FA, DCO-FA, E-210, E-230, E-250, E-270, E-70G, J-50, J-420, J-500, J-550S, J-530. J-630 and J-700); compounds having one or a plurality of amide bonds, such as stearic acid amide and hydroxystearic acid ethylene bisamide, (for example, trade names BYK-405 and Anti-Terra-205 produced by BYK Japan KK, and trade names GP-1 and EB-21 produced by AJINOMOTO HEALTHY SUPPLY, INC.); and urea compounds containing a urea bond and those with a moderately polar group or a low polar group introduced into a terminal (for example, trade names BYK-410, 411, 420, 425, 428, 430, 431, LPR20320, P104 and P105 produced by BYK Japan KK).

It is possible to use inorganic fine particles or organic fine particles as the rheology control agent. The inorganic fine particles are formed from one or more inorganic materials selected from, for example, alumina, aluminum hydroxide, magnesium hydroxide, calcium carbonate, magnesium carbonate, calcium silicate, magnesium silicate, calcium oxide, magnesium oxide, aluminum oxide, aluminum nitride, crystalline silica, amorphous silica, boron nitride and titania. The organic fine particles are formed from an organic material selected from, for example, a styrene-divinylbenzene copolymer, polystyrene, an alkyl methacrylate-butadiene-styrene copolymer, an alkyl acrylate-butadiene-styrene copolymer, an alkyl methacrylate-silicone copolymer, an alkyl acrylate-silicone copolymer, polyguanidine, polymethylmethacrylate, polybutadiene, polyamide, polyurethane, polyethylene, polypropylene, a phenol resin, a silicone rubber and polyacrylonitrile. It is also possible to use core/shell type organic fine particles constituted by a core layer and a shell layer, each including these organic materials. Types and shapes of the inorganic fine particles and the organic fine particles are not particularly limited.

The rheology control agent is added for giving thixotropy to the conductive adhesive. By thixotropy being given, precipitation of the conductive particles dispersed in the conductive adhesive is suppressed during frozen or chilled storage and during use at room temperature, which makes it possible to hold favorable storage stability of the conductive adhesive.

The rheology control agent can be used singly or in combinations of two or more kinds thereof. The rheology control agent is preferably at least one selected from, in particular, silica particles, and particles of polystyrene, a styrene-divinylbenzene copolymer, an alkyl methacrylate-butadiene-styrene copolymer, an alkyl acrylate-butadiene-styrene copolymer or an alkyl methacrylate-silicone copolymer, because of being excellent in dispersibility. Silica particles are subjected to a variety of surface treatments. The organic fine particles such as polystyrene particles preferably have a narrow particle size distribution.

A mean particle size of the above fine particles is preferably 100 μm or less and more preferably 30 μm or less. If the mean particle size exceeds 100 μm, a decrease in surface area of the fine particles allows viscosity and thixotropy to be lowered, and thus the suppressing effect on the precipitation of the conductive particles is lowered, and as a result, there is a possibility of causing deterioration in workability. A lower limit of the mean particle size of the fine particles is not particularly limited, but it is preferably 0.001 μm or more because an increase in surface area of the fine particles not only dramatically increases viscosity, but also reduces dispersibility.

The mean particle size and a maximum particle size of the above fine particles are measured by, for example, a method of measuring particle sizes of about 200 fine particles using a scanning electron microscope (SEM), or a method of measuring fine particles themselves using a particle size distribution measurement apparatus using the principle of a laser scattering diffraction method. Examples of the measurement method using SEM include a method of adhering an adherend using a conductive adhesive, then heating and curing it (preferably at 150 to 200° C. for 1 to 10 hours) to produce a sample, cutting a center portion of this sample, and observing a cross section surface thereof with SEM.

A content of the rheology control agent is preferably 0.1 to 50 parts by mass, and from the viewpoint of storage stability and conductive properties, more preferably 0.5 to 30 parts by mass, based on 100 parts by mass of the thermosetting resin. If the content of the rheology control agent is less than 0.1 parts by mass, viscosity tends to deteriorate and the suppressing effect on the precipitation of the conductive particles tends to be lowered, and if it exceeds 50 parts by mass, printability tends to deteriorate.

The conductive adhesive preferably has a viscosity of 100 to 500 Pa·s, and more preferably 150 to 300 Pa·s, as measured using a rotation viscometer under conditions of a measurement temperature of 25° C. and a rotation rate of 0.5 rpm, with taking into consideration stability during storage at a low temperature (−20 to 5° C.), in addition to printability and workability such as dispensing properties. If this viscosity is less than 100 Pa·s, a shape after printing and dispensing tends to be held with difficulty. On the other hand, if it has a viscosity of more than 500 Pa·s at 25° C. and 0.5 rpm, there is a high possibility that printability is impaired.

A ratio (B)/(A) of viscosity (B) of the conductive adhesive as measured under condition of a measurement temperature of 25° C. and a rotation rate of 0.5 rpm using a rotation viscometer after being left to stand at 25° C. for 24 hours, to viscosity (A) of the conductive adhesive as measured under the same conditions before being left to stand is preferably 0.7 to 1.5. If the ratio (B)/(A) is less than 0.7, there is a high possibility that the conductive particles precipitate so that the conductive adhesive is heterogeneous, and, printability and electric characteristics such as volume resistance may deteriorate. On the other hand, if the ratio (B)/(A) is more than 1.5, there is a possibility that curing of the thermosetting resin is progressing, and printability may deteriorate.

While the above viscosity can be measured using a known rotation viscometer, a rotation viscometer (for example, TV-33 type viscometer produced by TOKI SANGYO CO., LTD.) using an SPP rotor with special grooves formed is suitable for the conductive adhesive with a high viscosity. The viscosity before being left to stand is measured immediately after the conductive adhesive is prepared, specifically within 2 hours after all the components constituting the conductive adhesive are mixed.

The conductive adhesive may also comprise one or more additives selected from the group consisting of a flexible agent for stress relaxation, a diluent for enhancing workability, an adhesion force enhancer, a wettability enhancer and a defoamer, if necessary. Various additives in addition to these components may be included as long as the effects of the present invention are not impaired.

Examples of the flexible agent include liquid polybutadienes (trade names "CTBN-1300×31" and "CTBN-1300× 9" produced by Ube Industries, Ltd., and trade name "NISSO-PB-C-2000" produced by Nippon Soda Co., Ltd.). A content of the flexible agent is suitably 0 to 500 parts by mass, based on 100 parts by mass of the thermosetting resin.

The conductive adhesive may also comprise a coupling agent such as a silane coupling agent or a titanium coupling agent for the purpose of enhancing an adhesion force. Examples of the silane coupling agent include trade name"KBM-573" produced by Shin-Etsu Chemical Co., Ltd. The conductive adhesive may comprise an anion surfactant, a fluorinated surfactant, or the like for the purpose of enhancing wettability. The conductive adhesive may also comprise a silicone oil or the like as a defoamer. The above adhesion force enhancer, wettability enhancer, and defoamer each are used singly or in combinations of two or more. These are preferably included in an amount of 0.1 to 10% by mass based on the total amount of the conductive adhesive.

The conductive adhesive may also comprise a diluent, if necessary, for making workability during preparing the conductive adhesive and application workability during using the conductive adhesive more favorable. As such a diluent, organic solvents with a relatively high boiling point, such as butyl cellosolve, carbitol, butyl cellosolve acetate, carbitol acetate, dipropyleneglycol monomethylether, ethyleneglycol diethylether and α-terpineol, are preferred. This diluent is preferably included in an amount of 0.1 to 30% by mass based on the total amount of the conductive adhesive.

The aforementioned respective components may be any combination of those listed in each case.

The conductive adhesive is obtained as being a paste-like one in which the respective components are uniformly dispersed, which is obtained by heating the aforementioned respective components at once or in several times, if necessary, and mixing, dissolving, disaggregating and kneading, or dispersing them. Examples of an apparatus used in this case include a known stirrer, a kneader, a three-roller, a planetary mixer and the like.

The conductive adhesive of the present invention described above makes it possible to achieve a predetermined adhesion force and conductive properties at the same time by curing for a short time, while having favorable storage stability. The conductive adhesive of the present invention is suitably used for electrically connecting electrodes connected to a solar battery cell and wiring members.

FIG. 1 is a schematic view showing a main portion of one embodiment of a solar battery module, and schematically shows a structure in which a plurality of solar battery cells are wiring-connected to one another. FIG. 1(a) shows a solar battery module, viewed from the light-receiving surface side, FIG. 1(b) shows it, viewed from the rear surface side, and FIG. 1(c) shows it, viewed from the side surface side.

A solar battery module 100 includes a plurality of solar battery cells 6, a grid electrode 7 and a bus electrode (surface electrode) 3a provided on a light-receiving surface side of each of the solar battery cells 6, a rear surface electrode 8 and a bus electrode (surface electrode) 3b provided on a rear surface side of each of the solar battery cells 6, a first wiring member 4a placed opposite to the surface electrode 3a of the light-receiving surface side and a second wiring member 4b placed opposite to the surface electrode 3b of the rear surface side, and a conductive adhesive 10 interposed between the surface electrode 3a of the light-receiving surface side and the first wiring member 4a and between the surface electrode 3b of the rear surface side and the second wiring member 4b. The first wiring member 4a and the second wiring member 4b are connected to each other to thereby allow the plurality of solar battery cells 6 to be electrically connected in series.

The first wiring member 4a is electrically connected and adhered to the surface electrode 3a of the light-receiving surface side by a method including a step of heating the conductive adhesive to a temperature at which conductive particles melt (for example, a temperature equal to or higher than a melting point of a metal constituting the conductive particles), with the conductive adhesive being interposed between the surface electrode 3a of the light-receiving surface side and the first wiring member 4a. In the same manner, the second wiring member 4b is electrically connected and adhered to the surface electrode 3b of the rear surface side by a method including a step of heating the conductive adhesive to a temperature at which the conductive particles melt, with the conductive adhesive being interposed between the surface electrode 3b of the rear surface side and the second wiring member 4b.

As the first and second wiring members 4a and 4b, it is possible to use a Cu wire and a solder-plated wire to be usually used in the art. As the first and second wiring members 4a and 4b, it is also possible to use a film-shaped wiring board where metal wirings are formed on a plastic substrate.

FIG. 2 is a schematic view showing one embodiment of a method for manufacturing a solar battery. In the method of the embodiment shown in FIG. 2, a grid electrode 7 and a bus electrode (surface electrode) 3a connected to a light-receiving surface of a solar battery cell 6, as well as a rear surface electrode 8 connected to a rear surface of the solar battery cells 6 are provided (FIG. 2(a)).

Then, a liquid conductive adhesive 10 is applied to the surface electrode 3a, and a first wiring member 4a is placed opposite to a surface electrode 3a, with the applied conductive adhesive 10 interposed therebetween (FIG. 2(b)). The conductive adhesive can be applied by a method such as a dispensing method, a screen printing method, or a stamping method. Subsequently, the liquid conductive adhesive 10 is applied to the rear surface electrode 8, and a second wiring member 4b is placed opposite to the rear surface electrode 8, with the applied conductive adhesive 10 interposed therebetween (FIG. 2c)).

Thereafter, a sealing resin 15a is placed on a side, opposite to the solar battery cell 6, of the first wiring member 4a, and a sealing resin 15b is placed on a side, opposite to the solar battery cell 6, of the second wiring member 4b (FIG. 2(d)). The sealing resins 15a and 15b can be EVA which is an ethylene.vinyl acetate copolymer resin, or polyvinyl butyral, to be generally used.

Further, a glass substrate 16 is placed on the sealing resin 15a of the light-receiving surface side, and a protective film 17 referred to as a back sheet is placed on the sealing resin 15b of the rear surface side. By heating the whole in the obtained state to a temperature at which conductive particles in the conductive adhesive 10 melt, if necessary, under pressure, the first wiring member 4a and the second wiring member 4b are electrically connected and adhered to the surface electrode 3a and the rear surface electrode 8, respectively, and at the same time, the solar battery cell is sealed by the sealing resins 15a and 15b. Heating conditions at this time are, for example, at 150 to 170° C. for 1 minute to 30 minutes.

In this way, the adhesion of the wiring member and the sealing of the solar battery cell are performed at once to thereby make it possible to achieve a reduction in cost due to a remarkable shortening of a process and an enhancement in productivity as compared with the conventional method.

The method for manufacturing a solar battery is not limited to the above embodiment, and can be appropriately modified. For example, a connection of each of the wiring members may be performed sequentially or simultaneously and then the solar battery cell may be sealed, in place of performing the connection of the wiring members and electrodes and the sealing of the solar battery cell at once.

EXAMPLES

Hereinafter, the present invention will be more specifically described with reference to Examples. However, the present invention is not intended to be limited to these Examples.

1. Examples 1 to 8, Reference Examples 1 to 4

1-1. Production and Evaluation of Liquid Conductive Adhesive

A liquid conductive adhesive was prepared using the following materials.

(Thermosetting Resin)

YDF-170 (produced by Tohto Kasei Co., Ltd., trade name of bisphenol F type epoxy resin, epoxy equivalent=170)

TETRAD-X: amine type epoxy resin, produced by MITSUBISHI GAS CHEMICAL COMPANY INC., trade name (Curing Accelerator)

2PZ-CN (produced by SHIKOKU CHEMICALS CORPORATION, trade name of imidazole compound)

(Flux Activator)

BHBA: 2,2-bishydroxymethylbutanoic acid

BHVA: 2,2-bishydroxymethylpentanoic acid (Conductive Particles)

Sn42-Bi58 particles: melting point: 138° C., mean particle size: 20 μm

Sn42-Bi57-Ag1 (solder) particles: melting point: 139° C., mean particle size: 20 μm Sn96.5-Ag3-Cu0.5 solder: melting point: 217° C.

TCG-1: silver powders, produced by Tokuriki Chemical Research Co., Ltd., trade name MA05K: Ag-plated Cu powders, produced by Hitachi Chemical Co., Ltd., trade name Example 1

YDF-170, 2PZ-CN, and BHPA were mixed, and the mixture was passed through a three-roller three times to prepare an adhesive component. To 30 parts by mass of this adhesive component were added Sn42-Bi58 particles and mixed. The mixture thereof was passed through a three-roller further three times, and then subjected to a defoaming treatment using a vacuum stirring kneader at 500 Pa or less for 10 minutes to obtain a conductive adhesive.

Examples 2 to 7, Reference Examples 1 to 4

Conductive adhesives of Examples 2 to 7 and Reference Examples 1 to 4 were obtained by the same procedure as that in Example 1, except for using each material shown in Table 1 and Table 2 in each blending proportion shown in the Tables. The details of the materials shown in Tables 1 and 2 are as follows. The unit of the blending proportion of each material in Tables 1 and 2 is parts by mass.

TABLE 1

| | Item | Example 1 | Example 2 | Example 3 | Example 4 | Example 5 | Example 6 | Example 7 |
|---|---|---|---|---|---|---|---|---|
| Thermosetting resin | YDF-170 | 25.2 | 25.2 | 25.2 | 25.2 | — | — | — |
| | TETRAD-X | — | — | — | — | 25.2 | 25.2 | 25.2 |
| Curing accelerator | 2PZ-CN | 1.3 | 1.3 | 1.3 | 1.3 | 1.3 | 1.3 | 1.3 |
| Flux activator | BHPA | 3.5 | — | 3.5 | 3.5 | 3.5 | 3.5 | 3.5 |
| | BHBA | — | 3.5 | — | — | — | — | — |
| Conductive particles | Sn42—Bi58 | 70 | — | 60 | 60 | 70 | 60 | 60 |
| | Sn42—Bi57—Ag1 | — | 70 | — | — | — | — | — |
| | TCG-1 | — | — | 10 | — | — | 10 | — |
| | MA-05K | — | — | — | 10 | — | — | 10 |
| Appearance after connection | | Good | Good | Good | Good | Good | Good | Good |
| ΔF.F (%) | | 97.0 | 96.5 | 97.5 | 98.3 | 97.3 | 97.7 | 98.0 |

TABLE 2

| | Item | Reference Example 1 | Reference Example 2 | Reference Example 3 | Reference Example 4 |
|---|---|---|---|---|---|
| Thermosetting resin | YDF-170 | 25.2 | 25.2 | 25.2 | — |
| | TETRAD-X | — | — | — | 25.2 |
| Curing accelerator | 2PZ-CN | 1.3 | 1.3 | 1.3 | 1.3 |
| Flux activator | BHPA | — | 3.5 | — | — |
| | BHBA | — | — | — | — |
| Conductive particles | Sn42—Bi58 | 70 | — | 60 | 60 |
| | Sn42—Bi57—Ag1 | — | — | — | — |
| | TCG-1 | — | 70 | 10 | 10 |
| | MA-05K | — | — | — | — |
| Appearance after connection | | Good | Good | Good | Good |
| ΔF.F (%) | | 83.5 | 93.8 | 85.3 | 90.5 |

2. Measurement of Solar Battery Characteristics

A solar battery cell (125 mm×125 mm, thickness: 310 μm) was prepared in which surface electrodes (material: silver glass paste, 2 mm×125 mm) were formed on a light-receiving surface and a rear surface. The conductive adhesive was printed on the surface electrode on the light-receiving surface side using a metal mask (thickness: 100 μm, opening dimension: 1.2 mm×125 mm) and a printing shape was observed. Then, tab wires (produced by Hitachi Cable, Ltd., trade name: A-TPS), as a wiring member, covered with a solder were placed on the surface electrode of the solar battery cell with the printed conductive adhesive interposed therebetween, heated on a hot plate at 160° C. for 10 minutes, and adhered thereto. By the same processing, tab wires were also adhered to the surface electrode on the rear surface side to obtain a solar battery cell with tab wires. Appearance of the obtained solar battery cell with tab wires was visually observed.

An IV curve of the solar battery cell with tab wires was measured using a solar simulator (produced by WACOM ELECTRIC CO., LTD., trade name: WXS-155S-10, AM: 1.5G). Then, the solar battery cell was left to stand under a high temperature and high humidity atmosphere of 85° C. and 85% RH for 240 hours, and thereafter, the IV curve was measured in the same manner. Each fill factor (hereinafter, abbreviated as "F.F") showing solar battery characteristics was derived from each of the IV curves, and a change rate [=(F.F (240 h)/F.F (0 h))×100] of F.F (240 h) after leaving to stand under the high temperature and high humidity condition to F.F (0 h) before leaving to stand under the high temperature and high humidity was referred to as ΔF.F, which was used as an evaluation indicator. Generally, if a value of ΔF.F is 95% or more, it is determined that connection reliability is favorable. Evaluation results are shown in Tables 1 and 2.

Examples 8 to 18, Reference Examples 5 to 7

1. Production and Evaluation of Liquid Conductive Adhesive

Example 8

11.0 parts by mass of a bisphenol F type epoxy resin (YDF-170, produced by Tohto Kasei Co., Ltd., epoxy equivalent 170), 0.5 parts by mass of an imidazole compound (2PZ-CN, produced by SHIKOKU CHEMICALS CORPORATION) as a curing accelerator, 1.5 parts by mass of 2,2-bishydroxymethylpropionic acid (BHPA) as a flux activator, 0.4 parts by mass of hydrophobic surface-treated silica particles (R972, produced by Nippon Aerosil Co., Ltd., mean particle size: 16 nm) as a rheology control agent were mixed, and passed through a three-roller three times to prepare a adhesive component.

To the obtained adhesive component were added 87.0 parts by mass of Sn42-Bi58 particles (mean particle size: 20 μm, melting point: 138° C.) which are conductive particles, and mixed using a mortar for 20 minutes. Then, the mixture was subjected to a defoaming treatment using a vacuum stirring kneader for 10 minutes to obtain a conductive adhesive.

Examples 9 to 18, Reference Examples 5 to 7

Conductive adhesives of Examples 9 to 18 and Reference Examples 5 to 7 were obtained by the same procedure as that in Example 8 except for using each material shown in Table 3 and Table 4 in each blending proportion shown in the Tables. The details of the materials shown in Tables 3 and 4 are as follows. The unit of the blending proportion of each material in Tables 3 and 4 is parts by mass.

(Thermosetting Resin)
YDF-170 (produced by Tohto Kasei Co., Ltd., trade name of bisphenol F type epoxy resin, epoxy equivalent=170)
YH-434L: tetrafunctional polyglycidylamine type epoxy resin, produced by Tohto Kasei Co., Ltd.
ED-509S: tert-butylphenyl glycidylether, produced by ADEKA CORPORATION
(Curing Accelerator)
2PZ-CN (produced by SHIKOKU CHEMICALS CORPORATION, trade name of imidazole compound)
(Flux Activator)
BHBA: 2,2-bishydroxymethylbutanoic acid
BHVA: 2,2-bishydroxymethylpentanoic acid
(Conductive Particles)
Sn42-Bi58 particles: melting point: 138° C., mean particle size: 20 μm
Sn42-Bi57-Ag1 (solder) particles: melting point: 139° C., mean particle size: 20 μm
(Rheology Control Agent)
R805: silica particles hydrophobization-treated with octylsilane (produced by Nippon Aerosil Co., Ltd., mean particle size: 12 nm)
CS1: core/shell type organic fine particles having a core layer of a butadiene rubber and a shell layer of polymethylmethacrylate (produced by Rohm and Haas Japan K.K., EXL2655, mean particle size: 600 nm or less)
CS2: core/shell type organic fine particles having a core layer of a polyacrylic acid ester rubber and a shell layer of polymethylmethacrylate (produced by Mitsubishi Rayon Co., Ltd., W-450A, mean particle size: 600 nm or less)
RC1: modified urea compound (produced by BYK Japan KK, BYK410 (nonvolatile fraction: 52%))
RC2: polyamide amide compound (produced by BYK Japan KK, Anti-Terra-205 (nonvolatile fraction: 52%))
RC3: hydroxyfatty acid amide compound (produced by Itoh Oil Chemicals Co., Ltd., ITOHWAX J-630)
RC4: modified amide compound (produced by AJINOMOTO HEALTHY SUPPLY, INC., GP-1)

TABLE 3

| | Item | Example 8 | 9 | 10 | 11 | 12 | 13 | 14 | 15 | 16 | 17 | 18 |
|---|---|---|---|---|---|---|---|---|---|---|---|---|
| Thermosetting resin | YDF-170 | 11.0 | 11.0 | 11.0 | 11.0 | 11.0 | 8.0 | 11.0 | 11.0 | 11.0 | 11.0 | 11.0 |
| | YH-434L | — | — | — | — | — | 3.0 | — | — | — | — | — |
| Curing accelerator | 2PZ-CN | 0.5 | 0.5 | 0.5 | 0.5 | 0.5 | 0.5 | 0.5 | 0.5 | 0.5 | 0.5 | 0.5 |
| Flux activator | BHPA | 1.5 | 1.5 | — | 1.5 | 1.5 | 1.5 | 1.5 | 1.5 | 1.5 | 1.5 | 1.5 |
| | BHBA | — | — | 1.5 | — | — | — | — | — | — | — | — |
| Conductive particles | Sn42—Bi58 | 87.0 | — | 87.0 | 87.0 | 87.0 | 87.0 | 87.0 | 87.0 | 87.0 | 87.0 | 87.0 |
| | Sn42—Bi57—Ag1 | — | 87.0 | — | — | — | — | — | — | — | — | — |
| Rheology control agent | R972 | 0.4 | 0.4 | 0.4 | — | — | 0.4 | — | — | — | — | — |
| | R805 | — | — | — | 0.25 | — | — | — | — | — | — | — |
| | CS1 | — | — | — | — | 0.55 | — | — | — | — | — | — |
| | CS2 | — | — | — | — | — | — | 0.55 | — | — | — | — |
| | RC1 | — | — | — | — | — | — | — | 0.30 | — | — | — |
| | RC2 | — | — | — | — | — | — | — | — | 0.30 | — | — |
| | RC3 | — | — | — | — | — | — | — | — | — | 0.30 | — |
| | RC4 | — | — | — | — | — | — | — | — | — | — | 0.30 |

TABLE 4

| | Item | Reference Example 5 | 6 | 7 |
|---|---|---|---|---|
| Thermosetting resin | YDF-170 | 11.0 | 11.0 | 9.0 |
| | ED-509S | — | — | 9.0 |
| Curing accelerator | 2PZ-CN | 0.5 | 0.5 | 0.5 |
| Flux activator | BHPA | 1.5 | — | 1.5 |
| | BHBA | — | 1.5 | — |
| Conductive particles | Sn42—Bi58 | 87.0 | — | 80.0 |
| | Sn42—Bi57—Ag1 | — | 87.0 | — |
| Rheology control agent | R972 | — | — | 0.60 |

TABLE 6

| | Item | Reference Example 5 | 6 | 7 |
|---|---|---|---|---|
| Viscosity (Pa·s) | Immediately after production (A) | 320 | 334 | 4 |
| | After being left to stand at room temperature for 24 hours (B) | 148 | 127 | 2 |
| Appearance | After being left to stand at room temperature for 24 hours | Separation* Precipitation** | Separation* Precipitation** | Separation* Precipitation** |
| Change rate of viscosity (B/A) | | 0.46 | 0.38 | 0.50 |

*Separation: Conductive adhesive separated into two layers
**Presence of Precipitation: Conductive particles precipitated at the bottom Evaluation of Viscosity and Appearance The liquid conductive adhesive obtained by each of Examples and Reference Examples was stored into a glass container with a volume of 300 cc, and the viscosity of the conductive adhesive immediately after production and after being left to stand at room temperature (23 to 28° C.) for 24 hours were measured using a rotation viscometer to which a parallel plate was mounted (using an SPP rotor, produced by TOM SANGYO CO., LTD., TV-33 type viscometer). At the same time, appearance of the conductive adhesive was observed to confirm the presence or absence of separation and precipitation of the conductive particles. Evaluation results were shown in Table 5 and Table 6.

2. Measurement of Solar Battery Characteristics

The conductive adhesives of Examples 8, 9, 12, 13, 14 and 15 which exhibited favorable stability were used to perform production and evaluation of solar batteries in the same manner as those in Examples 1 to 7. Evaluation results are shown in Table 7.

TABLE 5

| | Item | Example 8 | 9 | 10 | 11 | 12 | 13 | 14 | 15 | 16 | 17 | 18 |
|---|---|---|---|---|---|---|---|---|---|---|---|---|
| Viscosity (Pa·s) | Immediately after production (A) | 368 | 375 | 353 | 392 | 335 | 372 | 423 | 436 | 388 | 416 | 406 |
| | After being left to stand at room temperature for 24 hours (B) | 343 | 378 | 328 | 373 | 298 | 351 | 391 | 470 | 390 | 399 | 429 |
| Appearance | After being left to stand at room temperature for 24 hours | No change | No change | No change | No change | No change | No change | No change | No change | No change | No change | No change |
| Change rate of viscosity (B/A) | | 0.93 | 1.01 | 0.93 | 0.95 | 0.89 | 0.94 | 0.92 | 1.08 | 1.01 | 0.96 | 1.06 |

TABLE 7

| Item | Example |  |  |  |  |  |
|---|---|---|---|---|---|---|
|  | 8 | 9 | 12 | 13 | 14 | 15 |
| Solar battery characteristics ΔF.F (%) | 97.2 | 97.8 | 96.3 | 96.9 | 97.5 | 97.1 |

Reference Example 8

A flux agent (produced by Senju Metal Industry Co., Ltd., trade name: Deltalux 533) was applied on a surface electrode on a light-receiving surface and on a rear surface of a solar battery cell. Tab wires covered with a Sn96.5-Ag3.0-Cu0.5 solder (produced by Hitachi Cable, Ltd., trade name: A-TPS) were placed on the surface electrode to which the flux agent was applied, heated on a hot plate to 260° C. to melt the solder covering the tab wires and to attempt to connect the tab wires and the surface electrode. However, the solar battery cell cracked during rapid cooling after heating to thereby make it impossible to measure solar battery characteristics.

It was confirmed from the above experiment results that the conductive adhesives of Examples 8 to 18 each exhibit favorable storage stability and exhibit excellent solar battery characteristics. On the other hand, it was found that the conductive adhesives of Reference Examples without a rheology control agent each have a decreased viscosity of an adhesive composition after being left to stand at room temperature, separate into two layers to cause the conductive particles to precipitate, and are inferior in storage stability. In addition, it was found that in Reference Example 8 where the tab wires covered with a conventional Sn96.5-Ag3.0-Cu0.5 solder are used, cracking of the solar battery cell occurs during cooling after connection and a process margin upon connection is narrow.

Example 19

A solar battery cell (125 mm×125 mm, thickness: 310 μm) was prepared in which surface electrodes (material: silver glass paste, 2 mm×125 mm) were formed on a light-receiving surface and a rear surface. The conductive adhesive of Example 9 was printed on the surface electrode using a metal mask (thickness: 100 μm, opening dimension: 1.2 mm×125 mm) Tab wires (produced by Hitachi Cable, Ltd., trade name: A-TPS), as a wiring member, covered with a solder were placed on the printed conductive adhesive. Thereafter, tab wires were also placed by the same procedure on the surface electrode on the rear surface side of the solar battery cell, with the conductive adhesive interposed therebetween. Subsequently, a sealing resin (produced by Mitsui Chemicals Fabro, Inc., trade name: SOLAR EVA SC50B) and a protective film (produced by KOBAYASHI & CO., LTD., trade name: KOBATECH PV), and a sealing resin (produced by Mitsui Chemicals Fabro, Inc., SOLAR EVA SC50B) and a glass substrate (200×200×3 mm) were laminated on the rear surface side of the solar battery cell and the light-receiving surface side of solar battery cell, respectively. The obtained laminate was loaded on a heating plate side of a vacuum laminator (produced by NPC Incorporated, trade name: LM-50×50-S) so as to be in contact with a glass substrate, and drawn a vacuum for 5 minutes. Thereafter, the laminate was heated at 165° C. for 10 minutes with the vacuum being released in the vacuum laminator, to produce a solar battery. Characteristics of the obtained solar battery were measured by the same method as that in Example 8. As a result, protrusion of the adhesive from the surface electrodes and the tab wires was little, good appearance was shown and ΔF.F after being left to stand at 85° C. and 85% RH for 240 hours was 96.8%, and it was thus found that favorable characteristics are exhibited.

REFERENCE SIGNS LIST

3a: bus electrode (surface electrode); 3b: bus electrode (surface electrode); 4a: first wiring member; 4b: second wiring member; 6: solar battery cell; 7: grid electrode; 8: rear surface electrode; 10: conductive adhesive; 15a, 15b: sealing resin; 16: glass substrate; 17: protective film; 100: solar battery module.

The invention claimed is:

1. A conductive adhesive comprising:
   conductive particles including a metal;
   a thermosetting resin;
   a flux activator; and
   a rheology control agent;
   wherein the conductive adhesive has a viscosity of 100 to 500 Pa·s, as measured using a rotation viscometer under conditions of a measurement temperature of 25° C. and a rotation rate of 0.5 rpm, and the conductive adhesive has properties whereby it is used for electrically connecting and adhering wiring members to an electrode connected to a solar battery cell,
   wherein a ratio of viscosity measured under conditions of a measurement temperature of 25° C. and a rotation rate of 0.5 rpm using a rotation viscometer after being left to stand at 25° C. for 24 hours, to viscosity as measured under conditions of a measurement temperature of 25° C. and a rotation rate of 0.5 rpm using a rotation viscometer before being left to stand is 0.7 to 1.5, and
   wherein the flux activator is a compound having a hydroxyl group and a carboxyl group.

2. The conductive adhesive according to claim 1, wherein the conductive particles include at least one kind of metal selected from the group consisting of bismuth, indium, tin and zinc.

3. The conductive adhesive according to claim 2, wherein the conductive particles include bismuth as the metal.

4. A solar battery comprising:
   a solar battery cell;
   electrodes connected to a light-receiving surface side and a rear surface side of the solar battery cell, respectively;
   a first wiring member placed opposite to the electrode of the light-receiving surface side and a second wiring member placed opposite to the electrode of the rear surface side; and
   the conductive adhesive according to claim 1, interposed between the electrode of the light-receiving surface side and the first wiring member and between the electrode of the rear surface side and the second wiring member;
   wherein the first wiring member is electrically connected and adhered to the electrode of the light-receiving surface side and the second wiring member is electrically connected and adhered to the electrode of the rear surface side.

5. A method for manufacturing a solar battery, comprising the steps of:
   applying the conductive adhesive according to claim 1 to electrodes connected to a light-receiving surface side and to a rear surface side of a solar battery cell, respectively;
   placing a first wiring member opposite to the electrode connected to the light-receiving surface side and placing a second wiring member opposite to the electrode connected to the rear surface side, with the applied conductive adhesive interposed therebetween; and placing a sealing resin on a side, opposite to the solar battery cell, of each of the first wiring member and the second wiring member, placing a glass substrate on the sealing resin of the light-receiving surface side, placing a protective film on the sealing resin of the rear surface side, and heating the whole in the obtained state, thereby sealing the solar battery cell while electrically connecting and adhering the first wiring member and the second wiring member respectively to the electrode connected to the light-receiving surface side and the electrode connected to the rear surface side.

6. A solar battery module comprising:

a plurality of solar battery cells;

electrodes connected to a light-receiving surface side and a rear surface side of each of the plurality of solar battery cells, respectively;

a first wiring member placed opposite to the electrode of the light-receiving surface side and a second wiring member placed opposite to the electrode of the rear surface side; and the conductive adhesive according to claim 1, interposed between the electrode of the light-receiving surface side and the first wiring member and between the electrode of the rear surface side and the second wiring member;

wherein the first wiring member is electrically connected and adhered to the electrode of the light-receiving surface side and the second wiring member is electrically connected and adhered to the electrode of the rear surface side.

7. The conductive adhesive according to claim 1, wherein the thermosetting resin includes at least one of an epoxy resin and a (meth)acrylic resin.

8. The conductive adhesive according to claim 1, wherein a melting point of the conductive particles is 220° C. or lower.

9. The conductive adhesive according to claim 1, wherein the flux activator is a compound that removes an oxide film formed on surfaces of the conductive particles including a metal, and the rheology control agent is a compound which gives thixotropic properties to the conductive adhesive.

10. The conductive adhesive according to claim 9, wherein a content of the flux activator in the conductive adhesive is 0.5 to 20 parts by mass, based upon 100 parts by mass of the conductive particles, and a content of the rheology control agent in the conductive adhesive is 0.1 to 50 parts by mass, based on 100 parts by mass of the thermosetting resin.

11. The conductive adhesive according to claim 9, wherein the rheology control agent includes inorganic or organic fine particles, having a mean particle size of 100 μm or less and 0.001 μm or more.

12. The conductive adhesive according to claim 1, wherein the conductive adhesive is a liquid.

* * * * *